United States Patent
Kawaguchi et al.

(10) Patent No.: US 9,332,682 B2
(45) Date of Patent: May 3, 2016

(54) METHOD OF MOUNTING ELECTRONIC PARTS

(75) Inventors: Teppei Kawaguchi, Yamanashi (JP); Takahiro Noda, Fukuoka (JP); Takuya Yamazaki, Yamanashi (JP); Toru Chikuma, Yamanashi (JP); Yoshiyuki Hattori, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 439 days.

(21) Appl. No.: 13/813,802

(22) PCT Filed: Jun. 21, 2011

(86) PCT No.: PCT/JP2011/003538
§ 371 (c)(1),
(2), (4) Date: Feb. 1, 2013

(87) PCT Pub. No.: WO2012/017593
PCT Pub. Date: Feb. 9, 2012

(65) Prior Publication Data
US 2013/0129468 A1 May 23, 2013

(30) Foreign Application Priority Data

Aug. 3, 2010 (JP) ................................ 2010-174119

(51) Int. Cl.
*H05K 13/02* (2006.01)
*H05K 13/08* (2006.01)
*H05K 13/00* (2006.01)

(52) U.S. Cl.
CPC ............ *H05K 13/02* (2013.01); *H05K 13/0061* (2013.01); *H05K 13/08* (2013.01)

(58) Field of Classification Search
None
See application file for complete search history.

(56) References Cited

U.S. PATENT DOCUMENTS

| | | | |
|---|---|---|---|
| 2004/0128827 A1 | 7/2004 | Shimizu et al. | |
| 2010/0050426 A1 | 3/2010 | Shimizu et al. | |

(Continued)

FOREIGN PATENT DOCUMENTS

| | | | |
|---|---|---|---|
| JP | 2000124671 A | 4/2000 | |
| JP | 2001308598 A | 11/2001 | |

(Continued)

OTHER PUBLICATIONS

International Search Report for Application No. PCT/JP2011/003538 dated Jul. 19, 2011.

*Primary Examiner* — Ryan Jarrett
(74) *Attorney, Agent, or Firm* — Pearne & Gordon LLP

(57) ABSTRACT

In an electronic component mounting method, electronic components are picked up from a component supply unit in which first and second tray supply mechanisms are arranged, and mounted on substrates. In the method, a first substrate and a second substrate different in type from the first substrate are transported by first and second substrate transport lanes, respectively, and a first component to be mounted on the first substrate and a second component to be mounted on the second substrate are supplied by the first and second tray supply mechanisms, respectively. If use stop setting indicating that the pickup of the electronic components is no longer conducted is enabled in one tray supply mechanism, the controller prohibits an access of a mounting head to the one tray supply mechanism, and permits an operation access of an operator to a tray housing unit of the one tray supply mechanism.

5 Claims, 7 Drawing Sheets

(56) References Cited

U.S. PATENT DOCUMENTS

| | | |
|---|---|---|
| 2010/0325860 A1 | 12/2010 | Maenishi |
| 2013/0129467 A1 * | 5/2013 | Kawaguchi et al. .......... 414/806 |

FOREIGN PATENT DOCUMENTS

| | | |
|---|---|---|
| JP | 2004128400 A | 4/2004 |
| JP | 2004335951 A | 11/2004 |
| JP | 2006086483 A | 3/2006 |
| JP | 2008186992 A | 8/2008 |
| JP | 2009239257 A | 10/2009 |
| JP | 2010135364 A | 6/2010 |
| WO | WO 0016601 A1 * | 3/2000 |

* cited by examiner

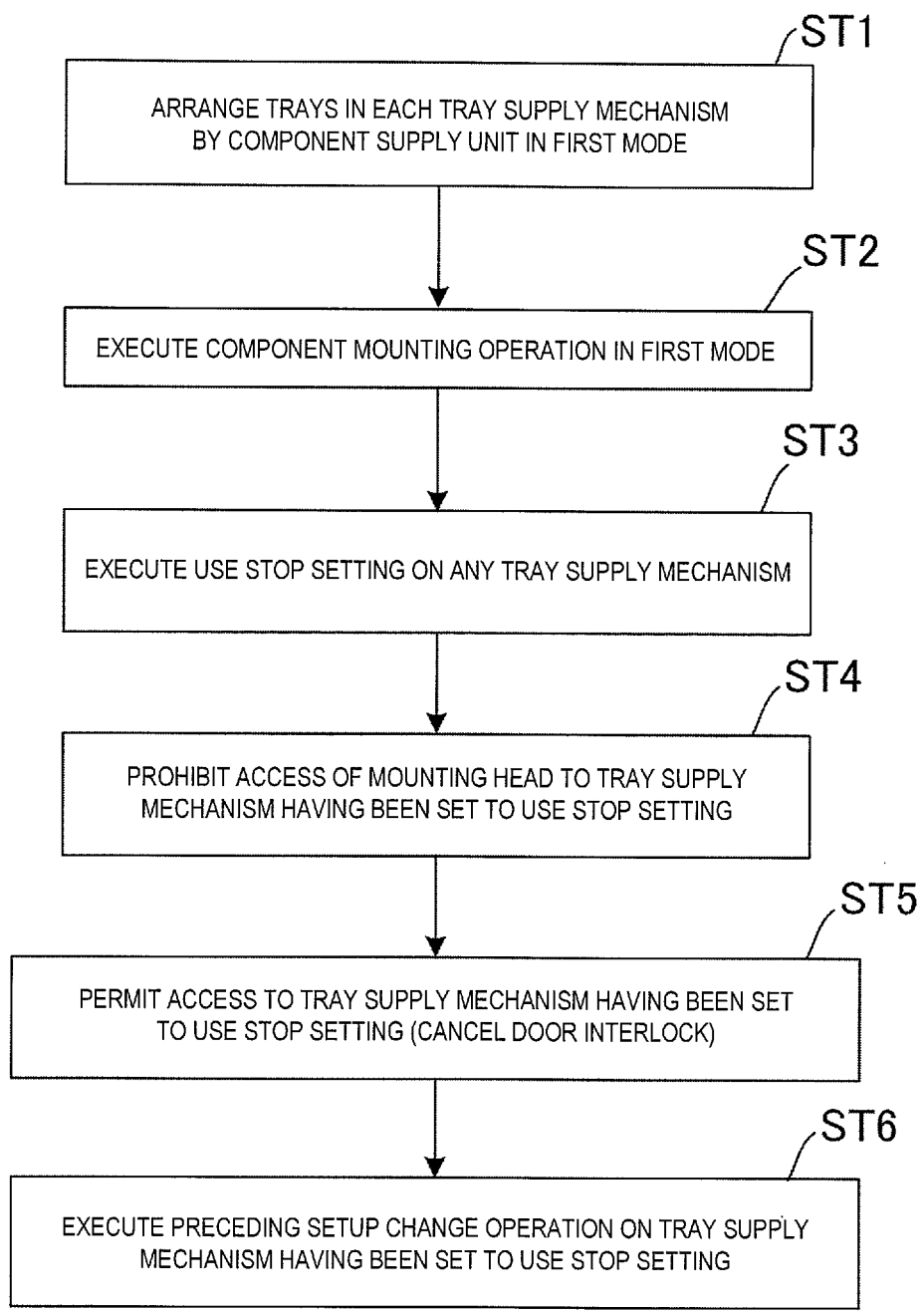

METHOD OF MOUNTING ELECTRONIC PARTS

TECHNICAL FIELD

The present invention relates to an electronic component mounting method in which electronic components are picked up from a component supply unit including a tray feeder and then transferred and mounted on substrates.

BACKGROUND ART

The electronic component mounting apparatus for mounting the electronic components on the substrates includes a component supply unit in which a parts feeder that supplies the electronic components is arranged, and the electronic components are picked up from the component supply unit, and then transferred and mounted on the substrates by a mounting head. When there are a large number of types of the electronic components to be mounted in the same mounting stage, plural types of parts feeders are coupled to the component supply unit. When a large-sized electronic part is included, a tray feeder for picking up the electronic components from trays each having the electronic components stored in a plane is arranged as the part feeder (for example, see Patent Document 1).

In the related art disclosed in the Patent Document, two component supply units are arranged to face each other through a conveyer that transports the substrates. In one of the component supply units, a plurality of tape feeders are arranged in parallel. In the other of the component supply units, two tray feeders are arranged in parallel. The combination of types of the components housed in those two tray feeders is made, taking a component type required for the operation of mounting the substrate to be mounted into account. As a result, even if the components are out of stock in one tray feeder, the target tray feeder for picking up the components is switched to the other tray feeder, resulting in an advantage that the component mounting operation can be continued so as to reduce a frequency of the device stop due to the shortage of components.

RELATED ART DOCUMENTS

Patent Documents

Patent Document 1: JP-A-2000-124671

SUMMARY OF THE INVENTION

Problem to be Solved by the Invention

However, the above-mentioned related art has drawbacks regarding the flexibility for switching the type of components to another, which is required to deal with a high-mix low-volume production system, as described below. That is, in the high-mix low-volume production system in which the type of products to be produced is frequently changed, a device stop time associated with a setup change operation at the time of switching the type of products to another is required to be reduced as much as possible. In order to achieve this, it is desirable that the setup change operation for replacing the existing tray with a tray storing the type of components necessary for a subsequent type of products therein is executed in advance while the production of the existing type of products is being executed. However, in the above-mentioned related art, it is assumed that when the components are out of stock in one tray feeder, one tray feeder is changed to the other tray feeder for retrieving the components. As a result, the setup change operation cannot be executed in advance.

An object of the present invention is to provide a component mounting method that can execute the setup change operation for switching the type of products to another in advance, and can reduce the device stop time associated with the product type switching.

Means for Solving the Problem

An electronic component mounting method uses an electronic component mounting apparatus including: a substrate transport mechanism including a first substrate transport lane and a second substrate transport lane which transport substrates on which electronic components are to be mounted and which are arranged in parallel; a component supply unit that is disposed on a side of the substrate transport mechanism and supplies the electronic components; and a tray feeder that includes a first tray supply mechanism and a second tray supply mechanism arranged in parallel, each having a function of retrieving trays from a tray housing unit that is disposed in the component supply unit and houses the trays storing therein the electronic components in a plane, and transferring the trays to a component pickup position; a component mounting mechanism including: a mounting head that picks up and holds the electronic components from the trays transferred to the component pickup position; and a head transfer mechanism that transfers the mounting head; and a controller that controls the substrate transport mechanism, the component supply unit, and the component mounting mechanism, whereby the electronic components are picked up from the component supply unit by the mounting head, and mounted on the substrates transported by the substrate transport mechanism, the component mounting method including: transporting a first substrate by the first substrate transport lane, and a second substrate different in type from the first substrate by the second substrate transport lane; supplying a first component to be mounted on the first substrate by the first tray supply mechanism, and a second component to be mounted on the second substrate by the second tray supply mechanism; and allowing, if use stop setting indicating that the pickup of the electronic components from a tray supply mechanism is no longer conducted is enabled in one of the first tray supply mechanism and the second tray supply mechanism, the controller to prohibit an access of the mounting head to the tray supply mechanism having been set to the use stop setting, and to permit an operation access of an operator to the tray housing unit of the tray supply mechanism.

Advantages of the Invention

According to the present invention, in a component mounting configuration in which a first substrate and a second substrate are transported by a first substrate transport lane and a second substrate transport lanes, respectively, and a first component to be mounted on the first substrate and a second component to be mounted on the second substrate are supplied by a first tray supply mechanism and a second tray supply mechanism, respectively, if use stop setting indicating that the pickup of the electronic components from a tray supply mechanism is no longer conducted is enabled in one of the two tray supply mechanisms, an access of the mounting head to the tray supply mechanism having been set to the use stop setting is prohibited, and an operation access of an operator to the tray housing unit of the tray supply mechanism is permitted. Consequently, setup change operation when a production type is switched can be executed in advance, and a device stop time associated with the type switching can be reduced.

BRIEF DESCRIPTION OF THE DRAWINGS

FIG. 6 is a flowchart illustrating operation in an electronic component mounting method according to the embodiment of the present invention.

MODE FOR CARRYING OUT THE INVENTION

Figure 1:
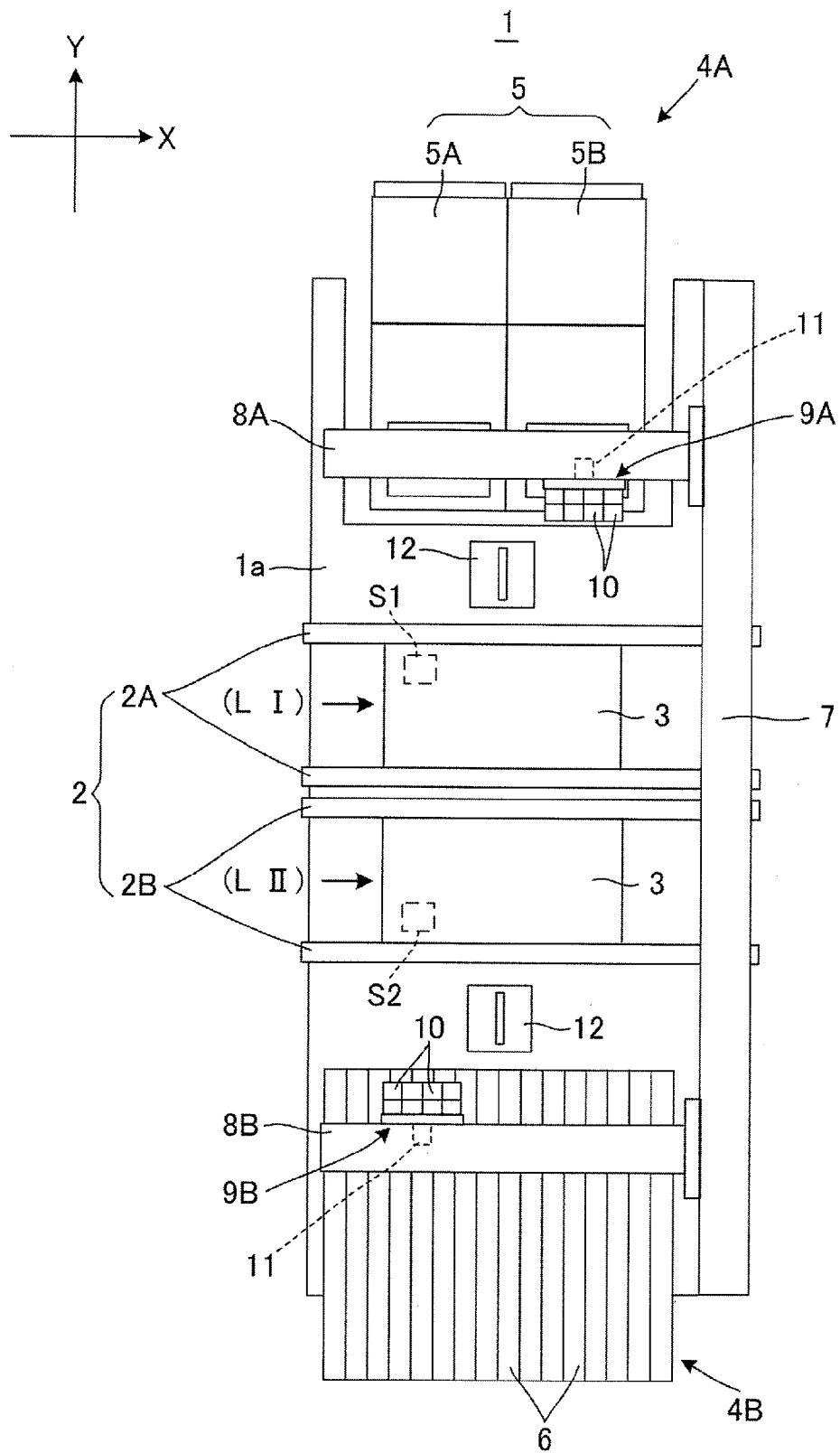
FIG. 1 is a plan view of an electronic component mounting apparatus according to an embodiment of the present invention.

Subsequently, an embodiment of the present invention will be described with reference to the drawings. First, a structure of an electronic component mounting apparatus 1 will be described with reference to FIGS. 1 and 2. Referring to FIG. 1, a substrate transport mechanism 2 is arranged on a base 1a of the electronic component mounting apparatus 1. The substrate transport mechanism 2 is configured such that a first substrate transport lane LI and a second substrate transport lane LII for transporting respective substrates to be mounted are arranged in parallel to a substrate transport direction (X-direction). The first substrate transport lane LI and the second substrate transport lane LII are configured by a pair of first substrate transport conveyers 2A and a pair of second substrate transport conveyers 2B, respectively. Each of the first substrate transport lane LI and the second substrate transport lane LII transports a substrate 3 transferred from an upstream side, and positions and holds the substrate 3 at an operation position where operation is conducted by a component mounting mechanism which will be described later. The first substrate transport lane LI and the second substrate transport lane LII are equipped with substrate detection sensors S1 and S2, respectively, and each of the substrate detection sensors S1 and S2 detects the carried substrate 3.

Figure 2:
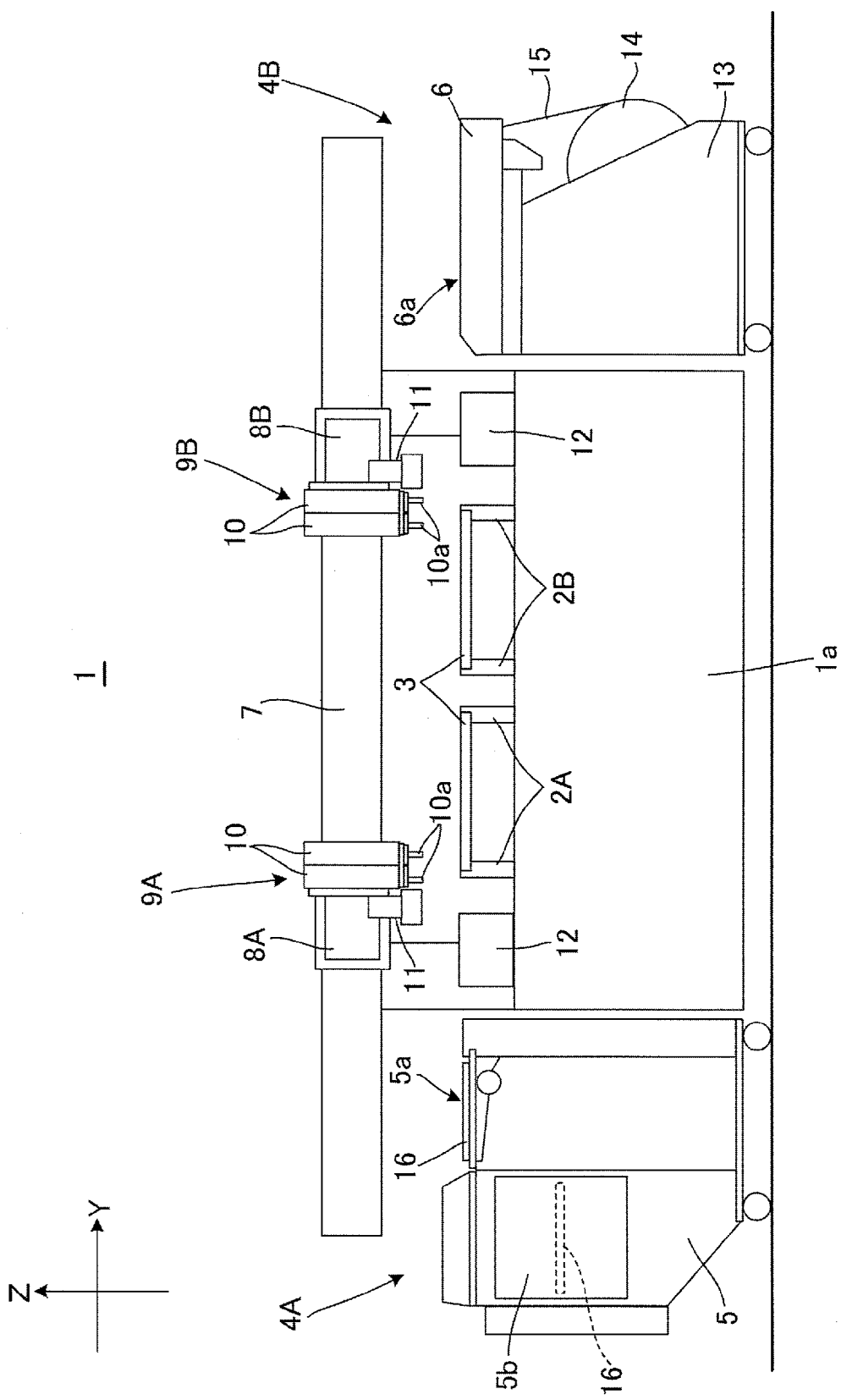
FIG. 2 is a side cross-sectional view of the electronic component mounting apparatus according to the embodiment of the present invention.

A first component supply unit 4A and a second component supply unit 4B are arranged on both sides of the substrate transport mechanism 2. A tray feeder 5 in which a first tray supply mechanism 5A and a second tray supply mechanism 5B are disposed in parallel is arranged in the first component supply unit 4A. As illustrated in FIG. 2, the first tray supply mechanism 5A and the second tray supply mechanism 5B configuring the tray feeder 5 have a function of retrieving, from each tray housing unit 5b, a pallet 16 that holds a tray storing relatively large-sized electronic components among electronic components to be mounted, in a plane, and moves the pallet 16 up to each component pickup position 5a.

A plurality of tape feeders 6 is disposed in parallel in the second component supply unit 4B. Each of the tape feeders 6 has a function of feeding a carrier tape 15 that holds small-sized electronic components up to a pickup position 6a (refer to FIG. 2) pitch by pitch. Each of the tape feeders 6 is mounted on a carriage 13 movably set in the second component supply unit 4B, and the carrier tape 15 is extracted from a supply reel 14 held by the carriage 13 and supplied to the tape feeder 6.

A Y-axial transfer table 7 is disposed on one end of an upper surface of the base 1a in a Y-direction, and a first X-axial transfer table 8A and a second X-axial transfer table 8B are mounted on the Y-axial transfer table 7 so as to be slidable in a Y-direction. A first mounting head 9A and a second mounting head 9B are mounted on the first X-axial transfer table 8A and the second X-axial transfer table 8B, respectively, so as to be slidable in the X-direction. Each of the first mounting head 9A and the second mounting head 9B is a multi-type head having a plurality of unit mounting heads 10. An adsorption nozzle 10a (refer to FIG. 2) that adsorbs and holds the electronic component is mounted on a lower end of each unit mounting heads 10.

With the driving of the Y-axial transfer table 7, the first X-axial transfer table 8A, and the second X-axial transfer table 8B, the first mounting head 9A and the second mounting head 9B transfer horizontally, individually, the first mounting head 9A picks up and holds the electronic component from the tray feeder 5 of the first component supply unit 4A, and the second mounting head 9B picks up and holds the electronic component from the tape feeders 6 of the second component supply unit 4B, so as to transfer and mount the electronic components on the substrates 3 carried in the first substrate transport lane LI and the second substrate transport lane LII. The Y-axial transfer table 7, the first X-axial transfer table 8A, and the second X-axial transfer table 8B configure a head transfer mechanism that transfers the first mounting head 9A and the second mounting head 9B. The head transfer mechanism, the first mounting head 9A, and the second mounting head 9B configure a component mounting mechanism that picks up the electronic components from the pallet 16 transferred to the component pickup position 5a of the tray feeder 5 in the first component supply unit 4A and from the tape feeders 6 in the second component supply unit 4B, and mounts the electronic components on the substrates 3.

A substrate recognition camera 11 transferred integrally with each of the first mounting head 9A and the second mounting head 9B is equipped in each of the first mounting head 9A and the second mounting head 9B so as to be located on a lower surface side of each of the first X-axial transfer table 8A and the second X-axial transfer table 8B. The first mounting head 9A and the second mounting head 9B are transferred above the respective substrates 3 so that the substrates 3 can be imaged by the respective substrate recognition cameras 11. The imaged results are subjected to recognition processing to recognize the positions of the substrates 3 and the component mounted points.

A component recognition camera 12 is disposed in a path along which each of the mounting heads 9A and 9B is transferred to the substrates 3 from a corresponding component supply unit thereof. Each of the mounting heads 9A and 9B holding the electronic components is transferred above the component recognition camera 12 whereby the held electronic component is imaged by the component recognition camera 12 to recognize the position of the electronic component that is held by each of the mounting heads 9A and 9B. In the operation of mounting the electronic components on the respective substrates 3, the mounting positions of the first mounting head 9A and the second mounting head 9B are corrected taking the substrate recognition results from the substrate recognition camera 11 and the component recognition results from the component recognition camera 12 into account.

Figure 3A:
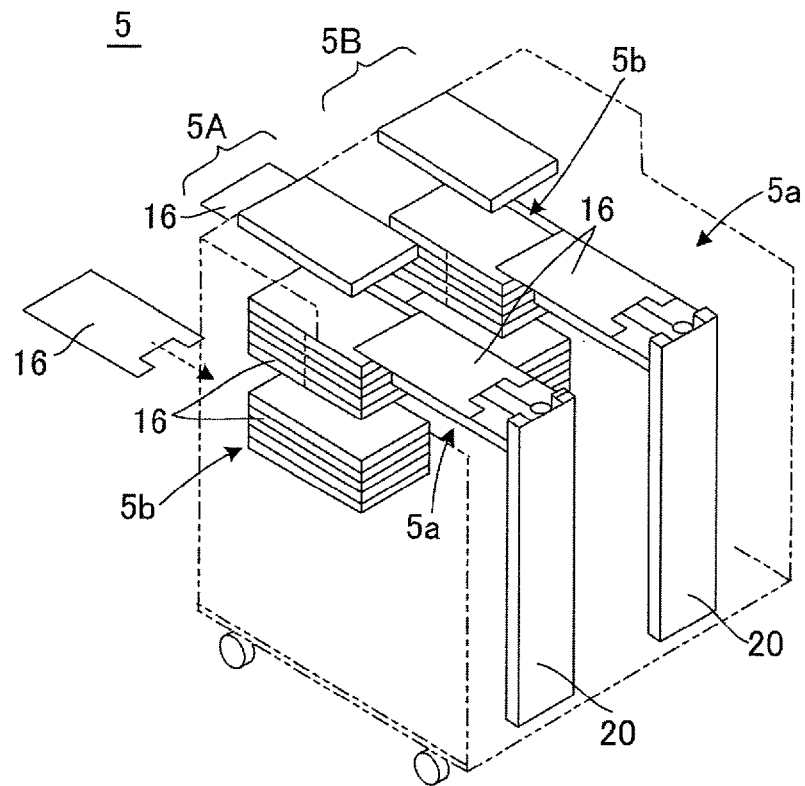
FIGS. 3(a) and 3(b) are illustrative views of a configuration of a tray feeder in the electronic component mounting apparatus used in the electronic component mounting apparatus according to the embodiment of the present invention.

Subsequently, a structure of the tray feeder 5 will be described with reference to FIGS. 3(a) and 3(b). As illustrated in FIG. 3(a), the tray feeder 5 is configured such that the first tray supply mechanism 5A and the second tray supply mechanism 5B, which are operable, independently, are arranged in parallel to each other. Each of the first tray supply mechanism 5A and the second tray supply mechanism 5B has a function of positioning each pallet 16 holding the tray in which the electronic component is stored to the component pickup position 5a.

Figure 3B:
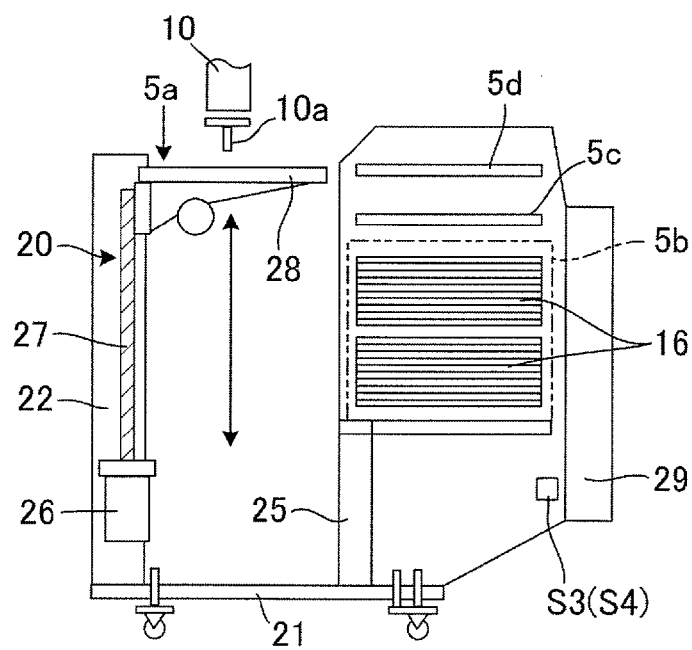

FIG. 3(b) illustrates a configuration of the first tray supply mechanism 5A and the second tray supply mechanism 5B. The tray housing units 5b are fixed to a frame 25, and a plurality of the pallets 16 stacked within the magazine is stacked within each tray housing unit 5b. The tray in which a large number of electronic components are stored in a reticular pattern is loaded into each of the pallets 16 housed within the tray housing units 5b. In the figure, the tray is not illustrated. Openable doors 29 are disposed in the rear of the tray housing units 5b, and the pallets 16 housed in the magazines are housed and retrieved for each of the magazines.

In this example, door open/close detection sensors S3 and S4 are disposed for the first tray supply mechanism 5A and the second tray supply mechanism 5B, respectively, and the door open/close detection sensors S3 and S4 detect the open/close state of the doors 29. The open/close state of the doors 29 is interlocked with an operation state of a movable mechanism unit of the electronic component mounting apparatus 1. For safety protection for the operator, in a state where the doors 29 are opened, the device operation is not permitted so far as a predetermined access allowance condition is not met.

Elevating mechanisms 20 each having a motor 26 and a feed screw 27 are disposed on a frame 22, and each of the elevating mechanisms 20 is driven to move up and down a pallet retrieving unit 28. Each pallet retrieving unit 28 retrieves the pallet 16 housed in the tray housing unit 5b, and holds the pallet 16 on an upper surface thereof. The pallet retrieving unit 28 is equipped with a pallet transfer mechanism (not shown), and the pallet 16 within the tray housing unit 5b can be retrieved to the pallet retrieving unit 28, or the pallet 16 can be pushed and fed into the tray housing unit 5b so as to be housed therein, by the pallet transfer mechanism. Each of the elevating mechanisms 20 is driven to move up the pallet retrieving unit 28, as a result of which the pallet 16 transfers to the component pickup position 5a of the electronic component which is picked up by each of the first mounting head 9A and the second mounting head 9Bm, together with the held tray.

Each of the first mounting head 9A and the second mounting head 9B picks up the electronic component from the tray held in the pallet 16 by the adsorption nozzle 10a of each unit mounting head 10, and transfers and mounts the picked up electronic component onto the substrate transport mechanism 2. Each ejection unit 5c that stores the electronic components ejected without being mounted is disposed above each of the tray housing units 5b, and each resupply unit 5d for retrieving the pallet 16 on which an empty tray is mounted after the electronic component has been picked up, or resupplying the pallet 16 after the electronic component has been resupplied is disposed above each ejection unit 5c.

Figure 4:
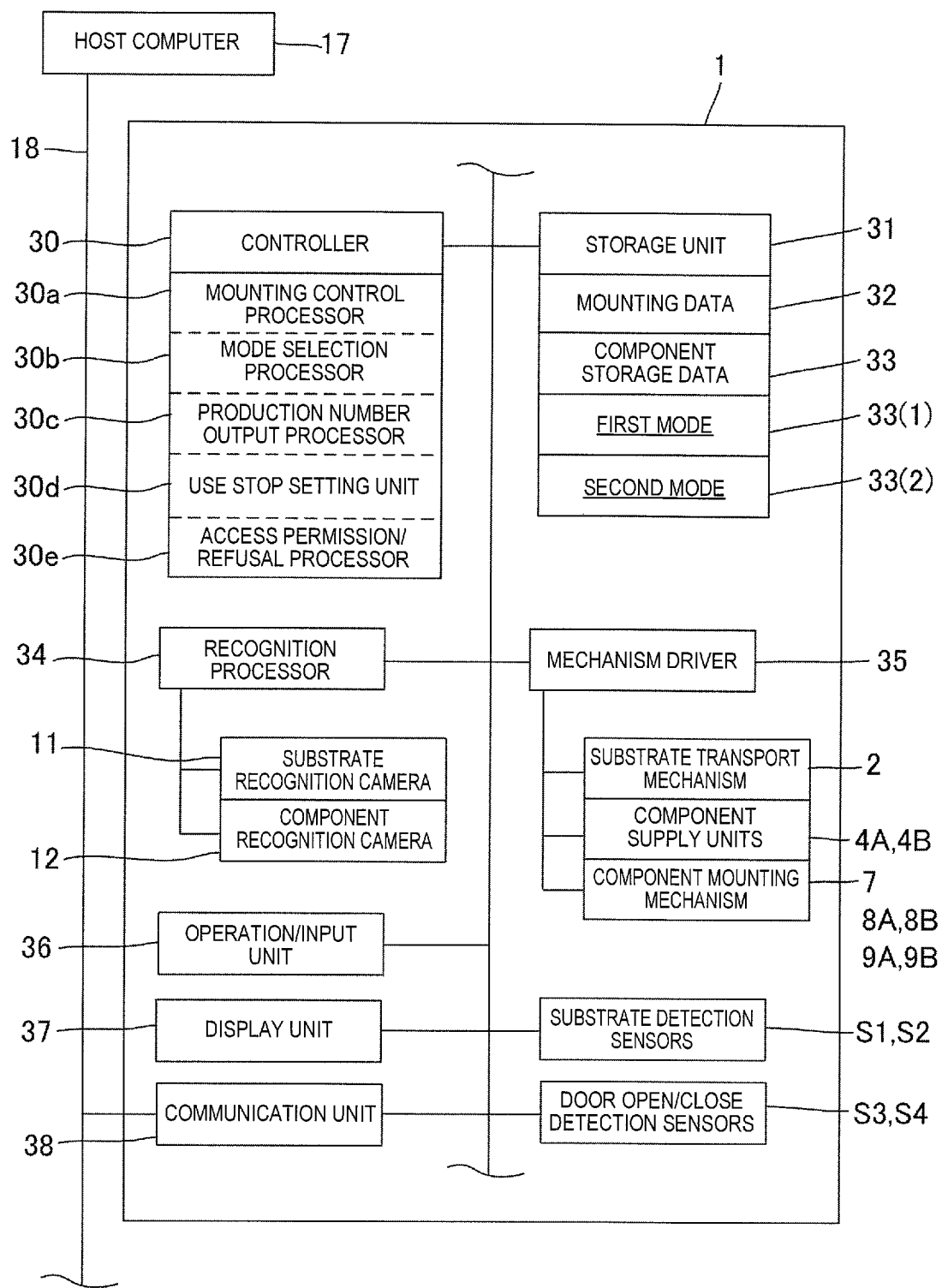
FIG. 4 is a block diagram illustrating a configuration of a control system of the electronic component mounting apparatus according to the embodiment of the present invention.

Subsequently, a configuration of the control system will be described with reference to FIG. 4. Referring to FIG. 1, the electronic component mounting apparatus 1 is connected to a host computer 17, which controls a component mounting line in the lump, through a LAN 18. The host computer 17 has a production management function of controlling an operation execution by the electronic component mounting apparatus 1 as well as managing the number of substrates of each type to be produced, and transmitting a production completion command to the electronic component mounting apparatus 1, as will be described later. The electronic component mounting apparatus 1 includes a controller 30, a storage unit 31, a recognition processor 34, a mechanism driver 35, an operation/input unit 36, a display unit 37, and a communication unit 38.

The controller 30 has a function of executing an operation control or arithmetic processing necessary for the operation of the electronic component mounting apparatus 1 on the basis of a control program or various data stored in the storage unit 31, and includes, as internal processing functions, a mounting control processor 30a, a mode selection processor 30b, a production number output processor 30c, a use stop setting unit 30d, and an access permission/refusal processor 30e. The mounting control processor 30a controls the mounting operation for mounting the electronic components on the substrates 3. The mode selection processor 30b selects an operation mode in the component mounting operation. In this embodiment, two types of a first mode and a second mode which will be described later are predetermined as operation modes, and those modes are selectively used according to a selection operation.

The first mode is an operation mode in which a correspondence relationship between the two first substrate transport lane LI and second substrate transport lane LII, and the first tray supply mechanism 5A and the second tray supply mechanism 5B in the tray feeder 5 is fixed to conduct the component mounting operation. The components are always supplied to the substrates 3 carried in the first substrate transport lane LI by the first tray supply mechanism 5A, and the components are always supplied to the substrates 3 carried in the second substrate transport lane LII by the second tray supply mechanism 5B.

On the contrary, in the second mode, both of the first tray supply mechanism 5A and the second tray supply mechanism 5B hold the trays that store the electronic components to be mounted on the substrates 3 of the same substrate type therein, and the components picked up from the same tray supply mechanism are mounted on the substrates 3 carried in each of the first substrate transport lane LI and the second substrate transport lane LII. In a component mounting process for picking up the electronic components from any one of the first tray supply mechanism 5A and the second tray supply mechanism 5B, and mounting the electronic components on the substrates 3, if the shortage of components occurs in one tray supply mechanism, the target tray supply mechanism for picking up the electronic components is switched to the other tray supply mechanism.

The production number output processor 30c computes and outputs the number of substrates 3 to be produced by the apparatus on the basis of the substrate detection results of the substrate detection sensors S1 and S2. That is, the production number output processor 30c counts substrate detection signals transmitted from the substrate detection sensors S1 and S2 in time series, and clocks substrate detection intervals, thereby being capable of counting the number of substrates really produced in the apparatus, and obtaining a production takt time indicative of a required operation time per one substrate on the basis of the substrate detection intervals. Then, production number output processor 30*c* can estimate an operation time required to complete a given scheduled number of substrates to be produced on the basis of the takt time and the remaining number of substrates to be produced.

That is, the production number output processor 30*c* can output any one of a scheduled number completion estimate signal for estimating a completion time point of the scheduled number of substrates to be produced in advance, and a scheduled number completion signal indicating that the number of substrates really produced reaches the scheduled number of substrates to be produced as the occasion demands. In other words, the production number output processor 30*c* has a production number counting function that outputs the scheduled number completion signal on the basis of the substrate detection sensors S1 and S2, and a scheduled production number completion estimating function that outputs the above-mentioned scheduled number completion estimate signal.

The use stop setting unit 30*d* conducts, in the first tray supply mechanism 5A and the second tray supply mechanism 5B configuring the tray feeder 5, a use stop setting process indicating that the pickup of the electronic components from those tray supply mechanisms is no longer conducted. With the execution of the use stop setting process, a movable mechanism such as the elevating mechanisms 20 of the tray supply mechanisms is prohibited from being operated, and a lock state of the door 29 is canceled to enable an access of the operator. Further, an access of the mounting heads to the tray supply mechanisms is prohibited.

In this embodiment, the use stop setting process is conducted on the basis of an output from the production number output processor 30*c* through the following method. First, when the production number output processor 30*c* outputs the scheduled number completion signal or the scheduled number completion estimate signal for a specific tray supply mechanism, the use stop setting unit 30*d* conducts the use stop setting process on the tray supply mechanism. If the host computer 17 that controls an electronic component mounting line in the lump is equipped with the same scheduled production number completion estimating function, the use stop setting unit 30*d* may conduct the use stop setting process on the basis of the scheduled number completion estimate signal received from the host computer 17. Further, the use stop setting unit 30*d* may conduct the use stop setting process according to determination of the operator who manages the electronic component mounting apparatus 1. In this case, the operator executes a given operation input on the operation/input unit 36 to transmit a command signal indicating that the use stop setting process is to be executed to the use stop setting unit 30*d*.

That is, in this embodiment, the use stop setting process is conducted by selecting the following method. First, the use stop setting process is conducted on the basis of the scheduled number completion estimate signal issued by the scheduled production number completion estimating function provided in the electronic component mounting apparatus 1 or the scheduled number completion estimate signal received from an external device, or the scheduled number completion signal issued by the production number counting function provided in the electronic component mounting apparatus 1. Further, as the occasion demands, the use stop setting process is conducted on the basis of the operation input to the use stop setting unit 30*d* of the controller 30 by the operator.

The access permission/refusal processor 30*e* sets whether an access of the mounting head and the operator to the tray supply mechanism is permitted, or not, for the tray supply mechanism that has been set to the use stop setting. That is, if the use stop setting has been conducted on any one of the first tray supply mechanism 5A and the second tray supply mechanism 5B, the access permission/refusal processor 30*e* conducts a control setting process for prohibiting an access of the mounting head to the tray supply mechanism that has been set to the use stop setting, and permitting the operation access of the operator to the tray storage unit 5*b* of the tray supply mechanism.

A technical significance of conducting the access refusal setting on the tray supply mechanism that has been set to the use stop setting will be described. With the execution of the use stop setting, the tray supply mechanism is excluded from a target of the component mounting operation which is being executed at that time, that is, a target to be accessed by the mounting head for pickup of the components. Accordingly, in the tray supply mechanism which is in the use stop setting state, with prohibition of the operation of a built-in movable mechanism, an access for operation such as component resupply or setup change by the operator may be permitted without any safety objection. The interlock of the door open/close detection sensors S3 and S4 that detect the open/close state of the door 29 with the movable mechanism unit of the electronic component mounting apparatus 1 is cancelled by the use stop setting, and the device operation is permitted even in a state where the door 29 is opened.

For that reason, in this embodiment, in the component mounting configuration in which the setup change operation such as exchange of the tray in the tray feeder 5 is required to be frequently executed, the tray feeder 5 is equipped with the first tray supply mechanism 5A and the second tray supply mechanism 5B, and the use stop setting process of those mechanisms can be executed at an appropriate timing. This makes it possible to start the setup change operation for a subsequent type of the substrates in advance at a timing as early as possible.

The storage unit 31 stores a variety of operation programs necessary for executing the component mounting operation as well as mounting data 32 and component storage data 33 therein. As illustrated in FIG. 5(*a*), the mounting data 32 associates a mounting point No. 32*a* indicating each mounting region of the substrate 3 to be mounted according to a mounting order with a component type 32*b* of the component to be mounted and mounting coordinates 32*c* specifying a mounting position. The mounting data 32 is created for each type of the substrates, and for example, if substrate types A, B, C, . . . are to be sequentially mounted, type A data 32A, type B data 32B, type C data 32C, . . . are created, and stored in the storage unit 31.

As illustrated in FIG. 5(*b*), the component storage data 33 includes a tray feeder section 33*a* indicative of the first tray supply mechanism 5A and the second tray supply mechanism 5B to be selectively used, a lane 33*b* specifying substrate transport lanes for component supply in each of the first tray supply mechanism 5A and the second tray supply mechanism 5B, and a substrate type 33*c* specifying the substrate type to be carried in the appropriate substrate transport lane and operated. In this example, two kinds of data including a first mode 33(1) and a second mode 33(2) are prepared in correspondence with the above-mentioned operation mode. When the component mounting operation is started, component storage for the first tray supply mechanism 5A and the second tray supply mechanism 5B is executed on the basis of those modes.

In the first mode 33(1), component supply targets of the first tray supply mechanism 5A and the second tray supply mechanism 5B are fixed to the first substrate transport lane L1 and the second substrate transport lane LII, respectively, and the different substrate types (NB, C/D, E/F) are sequentially carried in the first substrate transport lane LI and the second substrate transport lane LII for mounting.

That is, all of the components picked up from the first tray supply mechanism 5A are mounted on the substrates 3 (first substrates) of the substrate types A, C, and E carried in the first substrate transport lane LI, and the first tray supply mechanism 5A supplies first components to be mounted on the first substrates. Also, all of the components picked up from the second tray supply mechanism 5B are mounted on the substrates 3 (second substrates) of the substrate types B, D, and F carried in the second substrate transport lane LII, and the second tray supply mechanism 5B supplies second components to be mounted on the second substrates.

In other words, in the first mode, the first substrates are transported by the first substrate transport lane LI, and the second substrates different in type from the first substrates are transported by the second substrate transport lane LII. The first components to be mounted on the first substrates are supplied by the first tray supply mechanism 5A, and the second components to be mounted on the second substrates are supplied by the second tray supply mechanism 5B.

In the second mode 33(2), the substrate types to which the components are to be supplied by the first tray supply mechanism 5A and the second tray supply mechanism 5B are always the same substrate types (A/A, B/B, C/C). That is, first, the components picked up from the first tray supply mechanism 5A are mounted on the substrates 3 carried in the first substrate transport lane LI and the second substrate transport lane LII. Then, if the shortage of components occurs in the first tray supply mechanism 5A, the target tray supply mechanism for picking up the components is switched to the second tray supply mechanism 5B so as to continuously execute the component mounting operation.

Figures 5A, 5B:
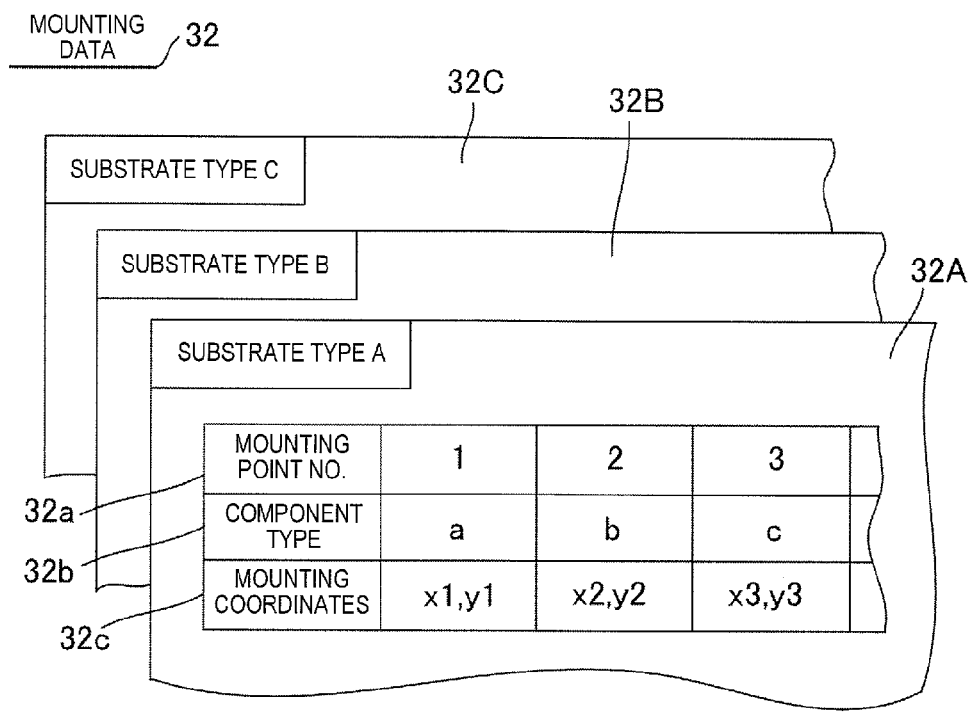
FIGS. 5(a) and 5(b) are illustrative views of mounting data and component storage data in the electronic component mounting apparatus according to the embodiment of the present invention.

In the example illustrated in FIG. 5(b), the different substrate types are carried in the first substrate transport lane LI and the second substrate transport lane LII for mounting. Alternatively, the same substrate types may be continuously carried in so far as the components of the same substrate type are stored in the first tray supply mechanism 5A and the second tray supply mechanism 5B. Also, in this example, the second operation mode is applied to the electronic component mounting apparatus 1 having two substrate transport lanes of the first substrate transport lane LI and the second substrate transport lane LII. However, the present invention is applicable to a configuration having a single substrate transport lane so far as the tray feeder 5 of a twin type having the first tray supply mechanism 5A and the second tray supply mechanism 5B is used.

The recognition processor 34 recognizes the imaged results of the substrate recognition camera 11 and the component recognition camera 12 to detect the component mounting position on the substrate 3, and discriminate the electronic components held by the first mounting head 9A and the second mounting head 9B and detect the position thereof. Those position detection results are taken into account in the control of the component mounting operation conducted by the mounting control processor 30a. The mechanism driver 35 is controlled by the mounting control processor 30a to drive a component mounting mechanism including the substrate transport mechanism 2, the first component supply unit 4A, the second component supply unit 4B, the Y-axial transfer table 7, the first X-axial transfer table 8A, the second X-axial transfer table 8B, the first mounting head 9A, and the second mounting head 9B.

The operation/input unit 36 is an input device such as a touch panel switch or a keyboard, and conducts an input of an operation command and a variety of data by the operator. The operation command includes an input command for conducting the use stop setting for the first tray supply mechanism 5A and the second tray supply mechanism 5B. The display unit 37 is a display panel such as liquid crystal, and displays a guide screen and a variety of annunciation screens when the input operation is conducted by the operation/input unit 36. The communication unit 38 communicates control signals and data with external devices such as the host computer 17 or another electronic component mounting apparatus which is connected through the LAN 18.

Figure 7:
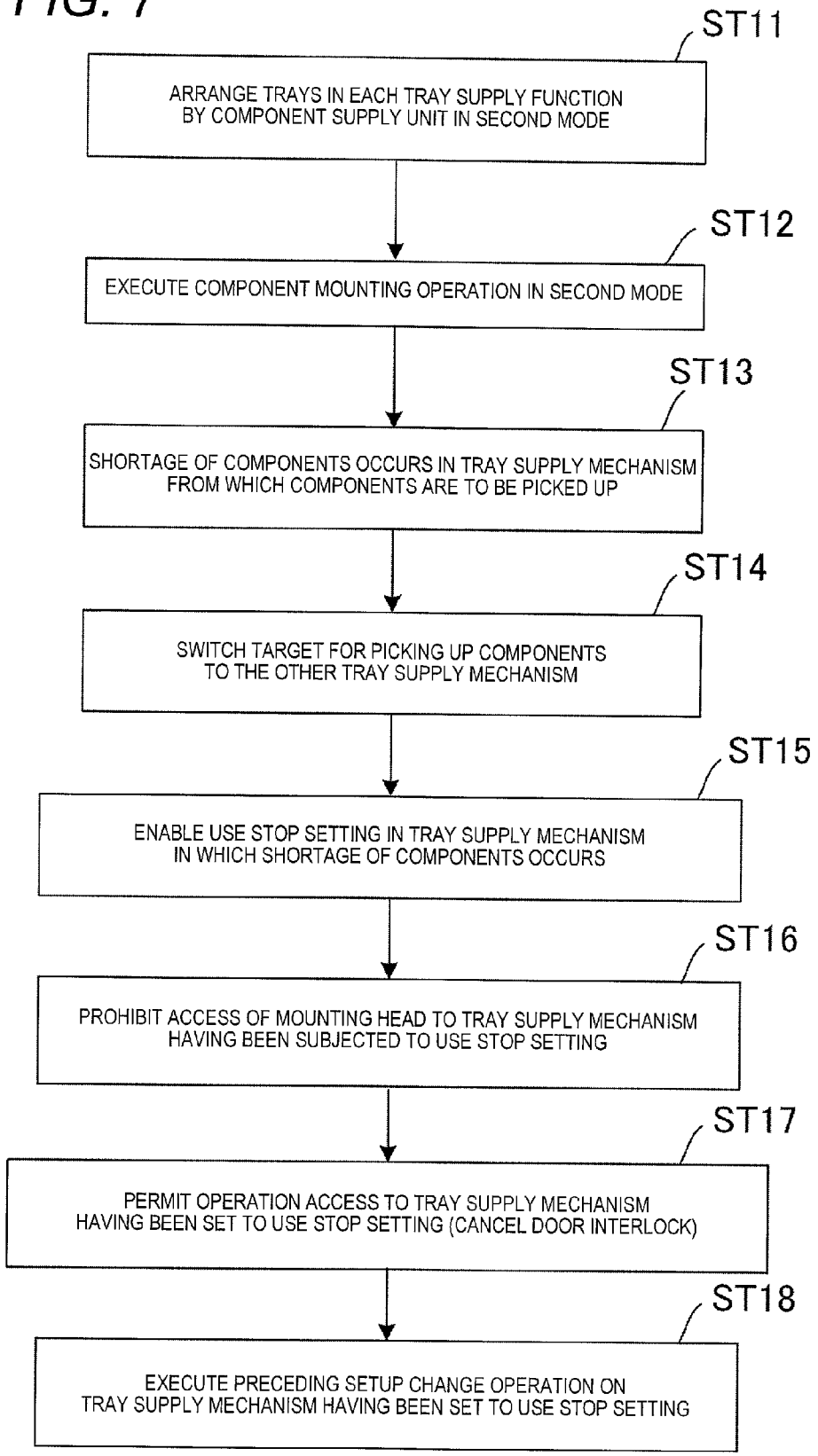
FIG. 7 is a flowchart illustrating operation in the electronic component mounting method according to the embodiment of the present invention.

The electronic component mounting apparatus 1 is configured as described above. Hereinafter, a description will be given of a component mounting method of picking up the electronic components from the component supply units 4A and 4B by the mounting heads 9A and 9B, and mounting the electronic components on the substrates 3 transported by the substrate transport mechanism 2 by using the electronic component mounting apparatus 1 according to flowcharts of FIGS. 6 and 7. FIGS. 6 and 7 illustrate a component mounting process that is executed by selecting the first mode or the second mode by the mode selection processor 30b.

First, the component mounting process in the first mode will be described with reference to FIG. 6. First, in the first component supply unit 4A, trays that store the electronic components therein are arranged in the first tray supply mechanism 5A and the second tray supply mechanism 5B in the first mode (ST1). That is, the pallets 16 on each of which the tray storing the components corresponding to the substrate type of the substrates 3 to be carried in the first substrate transport lane LI therein is mounted are housed in the first tray supply mechanism 5A. The pallets 16 on each of which the tray storing the components corresponding to the substrate type of the substrates 3 to be carried in the second substrate transport lane LII therein is mounted are housed in the second tray supply mechanism 5B.

Subsequently, the component mounting operation is executed in the first mode (ST2). In the component mounting process, if the scheduled production number completion signal or the scheduled production number completion estimate signal is output for the substrate type to be produced in the first substrate transport lane LI or the second substrate transport lane LII, the use stop setting unit 30d executes the use stop setting for the tray supply mechanism corresponding to the appropriate substrate transport lane (ST3).

Then, an access of the mounting head to the tray supply mechanism that has been set to the use stop setting is prohibited by the access permission/refusal processor 30e (ST4), and the interlock of the door 29 is canceled in the tray supply mechanism that has been set to the use stop setting, to thereby permit the operation access of the operator to the appropriate tray supply mechanism (ST5). As a result, the preceding setup change operation for producing the subsequent substrate type is executed for the tray supply mechanism that has been set to the use stop setting while continuing the component mounting operation for the substrate type that has not yet reached the scheduled production number (ST6).

Subsequently, a description will be given of the component mounting process in the second mode with reference to FIG. 7. First, in the first component supply unit 4A, trays that store the electronic components therein are arranged in the first tray supply mechanism 5A and the second tray supply mechanism 5B in the second mode (ST11). That is, the pallets 16 on each of which the tray storing the components corresponding to the same substrate type therein is mounted are housed in both of the first tray supply mechanism 5A and the second tray supply mechanism 5B. Then, the component mounting operation is executed in the second mode (ST12).

That is, the components picked up from the first tray supply mechanism 5A are mounted on the substrates 3 carried in the first substrate transport lane LI and the second substrate transport lane LII. Then, if the shortage of components occurs in the first tray supply mechanism 5A from which the components are to be picked up (ST13), the target tray supply mechanism for picking up the components switched to the other second tray supply mechanism 5B (ST14), and the component mounting operation is continuously executed. Then, the use stop setting is executed on the first tray supply mechanism 5A in which the shortage of components occurs (ST15). The processing associated with the subsequent use stop setting is the same as that in (ST4) to (ST6) illustrated in FIG. 6.

That is, in both of the mode 1 and the mode 2 illustrated in FIG. 7, the setup change operation for producing the subsequent substrate type can be started without waiting for the completion of the component mounting operation being executed. Accordingly, even if there is a need to frequently repetitively execute the setup change operation associated with the type switching for the plural types of substrates, the device stop time associated with the type switching can be reduced.

The present invention has been described in detail and with reference to the specific embodiments, but it would be obvious to an ordinary skilled person that various changes and modifications may be made in the present invention without departing from the spirit and scope of the present invention.

The present invention is based on Japanese Patent Application No. 2010-174119 filed on Aug. 3, 2010, and content thereof is incorporated herein by reference.

INDUSTRIAL APPLICABILITY

The electronic component mounting method according to the present invention have advantages that the setup change operation when the type is switched can be executed in advance, and the device stop time associated with the type switching can be reduced, and is useful in a field where the component mounting operation is conducted on various types of substrates.

DESCRIPTION OF REFERENCE SIGNS

1: Component Mounting Apparatus
2: Substrate Transport Mechanism
2A: First Substrate Transport Conveyer
2B: Second Substrate Transport Conveyer
3: Substrate
4A: First Component Supply Unit
4B: Second Component Supply Unit
5: Tray Feeder
5A: First Tray Supply Mechanism
5B: Second Tray Supply Mechanism
5a: Component Pickup Position
5b: Tray Storage Unit
6: Tape Feeder
7: Y-Axial Transfer Table
8A: First X-Axial Transfer Table
8B: Second X-Axial Transfer Table
9A: First Mounting Head
9B: Second Mounting Head
10: Unit Mounting Head
10a: Adsorption Nozzle
16: Pallet
20: Elevating Mechanism
29: Door
LI: First Substrate Transport Lane
LII: Second Substrate Transport Lane

The invention claimed is:

1. A component mounting method using an electronic component mounting apparatus comprising:
a substrate transport mechanism comprising a first substrate transport lane and a second substrate transport lane which transport substrates on which electronic components are to be mounted and which are arranged in parallel;
a component supply unit that is disposed on a side of the substrate transport mechanism and supplies the electronic components; and
a tray feeder that comprises a first tray supply mechanism and a second tray supply mechanism arranged in parallel, each having a function of retrieving trays from a tray housing unit that is disposed in the component supply unit and houses the trays storing therein the electronic components in a plane, and transferring the trays to a component pickup position;
a component mounting mechanism comprising: a mounting head that picks up and holds the electronic components from the trays transferred to the component pickup position; and a head transfer mechanism that transfers the mounting head; and
a controller that controls the substrate transport mechanism, the component supply unit, and the component mounting mechanism,
whereby the electronic components are picked up from the component supply unit by the mounting head, and mounted on the substrates transported by the substrate transport mechanism,
said component mounting method comprising:
transporting a first substrate by the first substrate transport lane, and a second substrate different in type from the first substrate by the second substrate transport lane;
supplying a first component to be mounted on the first substrate by the first tray supply mechanism, and a second component to be mounted on the second substrate by the second tray supply mechanism;
outputting a scheduled production number completion signal or a scheduled production number completion estimate signal for a substrate type of one of the first substrate and the second substrate;
executing, by the controller in response to the scheduled production number completion signal or the scheduled production number completion estimate signal, a use stop setting for one of the first tray supply mechanism and the second tray supply mechanism corresponding to the substrate type to which the scheduled production number completion signal or the scheduled production number completion estimate signal is outputted while continuing a component mounting operation by the other of the first tray supply mechanism and the second tray supply mechanism; and
executing a preceding setup change operation for producing a subsequent substrate type for the tray supply mechanism that has been set to the use stop setting while continuing a component mounting operation by allowing the controller to prohibit an access of the mounting head to the tray supply mechanism having been set to the use stop setting, and to permit an operation access of an operator to the tray housing unit of the tray supply mechanism.

2. The electronic component mounting method according to claim 1,
   wherein the use stop setting is enabled based on a scheduled number completion estimate signal issued by a scheduled production number completion estimating function provided in the electronic component mounting apparatus, or a scheduled number completion estimate signal received from an external device.

3. The electronic component mounting method according to claim 1,
   wherein the use stop setting is enabled based on a scheduled number completion signal issued by a production number counting function provided in the electronic component mounting apparatus.

4. The electronic component mounting method according to claim 1,
   wherein the use stop setting is enabled based on an operation input of the operator to the controller.

5. The electronic component mounting method according to claim 1,
   wherein the preceding setup change operation is executed while continuing the component mounting operation by using the tray supply mechanism that has not been set to the use stop setting.

* * * * *